US012755797B2

(12) United States Patent
Tian et al.

(10) Patent No.: US 12,755,797 B2
(45) Date of Patent: Oct. 6, 2026

(54) ENHANCED READ RETRY (ERR) FOR DATA RECOVERY IN FLASH MEMORY

(71) Applicant: Sandisk Technologies, Inc., Milpitas, CA (US)

(72) Inventors: Xuan Tian, Shanghai (CN); Liang Li, Beijing (CN); Vincent Yin, Shanghai (CN); Daniel J. Linnen, Naperville, IL (US)

(73) Assignee: Sandisk Technologies, Inc., Milpitas, CA (US)

( * ) Notice: Subject to any disclaimer, the term of this patent is extended or adjusted under 35 U.S.C. 154(b) by 492 days.

(21) Appl. No.: 18/355,090

(22) Filed: Jul. 19, 2023

(65) Prior Publication Data

US 2024/0304273 A1 Sep. 12, 2024

Related U.S. Application Data

(60) Provisional application No. 63/488,567, filed on Mar. 6, 2023.

(51) Int. Cl.

*G11C 16/26* (2006.01)
*G11C 11/56* (2006.01)
*G11C 16/04* (2006.01)
*G11C 16/34* (2006.01)
*G11C 29/52* (2006.01)

(52) U.S. Cl.

CPC .......... *G11C 16/26* (2013.01); *G11C 11/5642* (2013.01); *G11C 16/0483* (2013.01); *G11C 16/3459* (2013.01); *G11C 29/52* (2013.01)

(58) Field of Classification Search

CPC . G11C 16/26; G11C 11/5642; G11C 16/0483; G11C 16/3459; G11C 29/52; G11C 16/08; G11C 29/021; G11C 29/46; G11C 7/24; G11C 29/12; G11C 29/1201; G11C 29/12015; G11C 2029/1202; G11C 2029/1204; G11C 2029/1206; G11C 2029/5002; G11C 29/026; G11C 29/24

See application file for complete search history.

(56) References Cited

U.S. PATENT DOCUMENTS 10,541,034 B2 * 1/2020 Lien .................. G11C 16/0408
2007/0294588 A1 * 12/2007 Coulson .............. G06F 11/1068 714/42
2015/0003169 A1 * 1/2015 Nam .................. G11C 11/5628 365/185.25
2015/0301885 A1 * 10/2015 Yuan ...................... G11C 16/10 714/807
2016/0124642 A1 * 5/2016 Kim ..................... G11C 16/349 711/156
2017/0162259 A1 * 6/2017 Kim ....................... G11C 16/26
2017/0287564 A1 * 10/2017 Park ....................... G11C 29/52

(Continued)

*Primary Examiner* — Jay W. Radke

(74) *Attorney, Agent, or Firm* — Patterson + Sheridan, LLP

(57) ABSTRACT

A flash memory includes an improved error handling algorithm for data recovery. Rather than running a default read recovery only, an Enhance Read Retry (ERR) process also is performed. After running a default read recovery, WLs are flagged with an error flag if the read was unsuccessful. The flag triggers ERR mode. ERR mode implements increase of the row read bias or implements increase of row read time or implements multiple pulses at the same voltage, or a combination of all three.

11 Claims, 8 Drawing Sheets

(56) References Cited

U.S. PATENT DOCUMENTS

| | | | | |
|---|---|---|---|---|
| 2019/0042356 | A1* | 2/2019 | Chen | G11C 16/26 |
| 2019/0325969 | A1* | 10/2019 | Hong | G06F 11/1048 |
| 2020/0176066 | A1* | 6/2020 | Her | G06F 11/076 |
| 2020/0211653 | A1* | 7/2020 | Chen | G06F 11/1048 |

* cited by examiner

ENHANCED READ RETRY (ERR) FOR DATA RECOVERY IN FLASH MEMORY

CROSS-REFERENCE TO RELATED APPLICATIONS

This application claims benefit of U.S. provisional patent application Ser. No. 63/488,567, filed Mar. 6, 2023, which is herein incorporated by reference.

BACKGROUND OF THE DISCLOSURE

Field of the Disclosure

Embodiments of the present disclosure generally relate to an improved error handling for data recovery.

Description of the Related Art

Due to malformed contacts, there can be open connections to various row signals within a memory block. In some cases, select gate source (SGS) may not be charged up correctly during erase/program/read operation, leading to different types of failure events. Any sort of broken signal in a return material agreement (RMA) that connects to a NAND word line (WL) can cause a defective part per millions (DPPM) issue. In regards to open row signals, such signals can cause issues with read/verify because the row cannot be put into saturation and thus cannot conduct so all of the cells connected in series with the open row cannot conduct or at the very least do not fully conduct, which causes the rows to appear programmed or at least more programmed, which causes data loss in the case of reads.

Take SGS open as an example to embody possible failure events in the field. If SGS open occurs at erase, the SGS open will trigger an erase status failure (ESF) event. If SGS open happens during program operation, the SGS open won't trigger a program status failure (PSF) event because program verification will get a fake pass since the channel won't conduct anyway. Instead, the SGS open will cause verification of uncorrected error correction code (UECC) during the following read operation. The above two cases can be possibly covered by error handling, so the cases may not be system DPPM. The cases above may still be DPPM concerns for some products without such coverage. A critical issue is if an SGS open occurs during a latent read operation. Since a channel couldn't be made to conduct via the SGS, multiple WL data (multiple rows of data) loss may occur.

Moreover, an open location may not necessarily be confined to SGS. Generally, if any of select gate (SG), data or dummy WLs were to be open during a read operation, the channel will be cut off. A plurality of these lines can cause multiple read failures, which can include an open in the SGS line, but can also be an open in the select gate drain (SGD) line. Also an open location can happen in any word line (i.e., data word line, dummy word line, etc.). Any connection to a block can suffer from the kind of problems discussed above. Whenever at least one of these lines is opened, a gate along a data path channel cannot be charged so the channel will be cut off at the location of the gate, which will cause the multiple read failures because memory cells along the entire data path cannot be made to conduct for other WLs. Breaks are not limited to physical breaks but can be electrical breaks as well.

Therefore, there is a need in the art for an improved error handling for data recovery.

SUMMARY OF THE DISCLOSURE

The present disclosure generally relates to an improved error handling algorithm for data recovery. Rather than running only a default read recovery only, an Enhance Read Retry (ERR) algorithm is additionally run. After running a default read recovery, WLs will be flagged with an error flag if the read was unsuccessful. The flag triggers ERR mode.

In one embodiment, a data storage device comprises a memory device and a controller coupled to the memory device. The controller is configured to read a block of the memory device; determine that a read attempt of a first word line (WL) of the block failed; increase voltage from a first level to a second level on one or more of a select gate drain line (SGD), one or more dummy WLs, one or more data WLs, and a select gate source line (SGS); and retry to read data from the first WL.

In another embodiment, a data storage device comprises a memory device and a controller coupled to the memory device. The controller is configured to: read a block of the memory device; determine that a read attempt of a first WL of the block failed; trigger RC measurements for the first WL; increase a voltage on one or more of the WLs; and retry to read data from the first WL.

In yet another embodiment, a data storage device comprises memory means and a controller coupled to the memory means. The controller is configured to: determine that a read failure of one or more WLs of a block of the memory means has occurred; increase a voltage to one or more of the following until either the one or more WLs can be read via a read retry or a maximum voltage has been reached: a SGD; one or more dummy WLs; one or more data WLs; and a SGS.

Additionally, in addition to or alternatively to increasing voltage, enhanced read retry can also implement an increase of bias time or applying multiple pulses at the same voltage, or combinations of increasing voltage, bias time, of multiple pulses.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
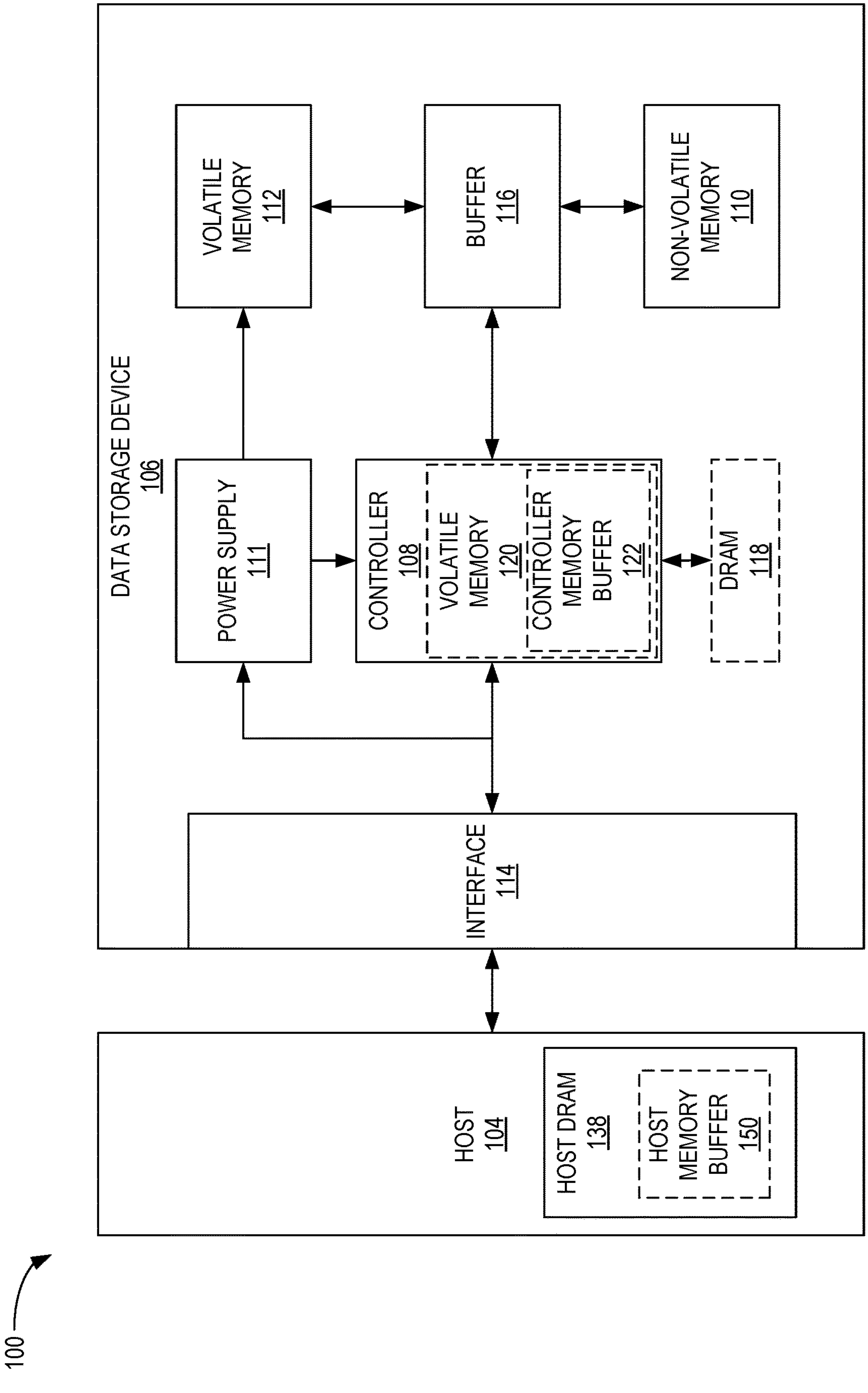
FIG. 1 is a schematic block diagram illustrating a storage system in which a data storage device may function as a storage device for a host device, according to certain embodiments.

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to an improved error handling algorithm for data recovery. Rather than running only a default read recovery, an Enhance Read Retry (ERR) algorithm is additionally run. After running a default read recovery, WLs will be flagged with an error flag if the read attempt was unsuccessful. The flag triggers ERR mode.

In regards to the open row issue, additional voltage, additional time for charging, or repeated pulses can be issued to the row that is open to mitigate the issue. So doing allows for the proper voltage to be reached so that the data can be read out properly. Such a solution can be enhanced by looking to see if the ones/zeros count of the data corresponds to significant disturb of the kind that would be caused by an open row. The solution can be enhanced by running row RC characterizations to determine what row signal is responsible for the issue.

Previously, row voltages were static (fixed) on the WLs apart from the WL being read. Additionally, row voltages were kept as low as possible so as to minimize read disturb issues. Also, read error recovery only focused on the WL being read and changing the voltages on that WL. As discussed herein, all three of the previous scenarios are changed such that the host's data can be recovered quickly. The solutions herein provide a pathway to detecting the problem and allows for the system to take appropriate actions such as block retirement or even die retirement if the problem occurs multiple times. The system can even use the block, with voltage modifications described herein, but it should be noted that continuing to use the block is risky as the defect causing the open WL behavior could degrade to being fully open, resulting in a catastrophic data loss. However, the block could be used for non-critical purposes such as error logging to be able to continue to use the block. Overall, the embodiments discussed herein are a manner of altering the row usage to overcome problems caused by open rows in read recovery. If not for the embodiments discussed herein of increasing the voltage or increasing the time or repeatedly pulsing the row signals (or some combination thereof), then there could not be a recovery of the data for the issues and as such would result in a very large amount of data being lost, potentially a full block's worth of data.

FIG. 1 is a schematic block diagram illustrating a storage system 100 having a data storage device 106 that may function as a storage device for a host device 104, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The host DRAM 138 may optionally include a host memory buffer (HMB) 150. The HMB 150 is a portion of the host DRAM 138 that is allocated to the data storage device 106 for exclusive use by a controller 108 of the data storage device 106. For example, the controller 108 may store mapping data, buffered commands, logical to physical (L2P) tables, metadata, and the like in the HMB 150. In other words, the HMB 150 may be used by the controller 108 to store data that would normally be stored in a volatile memory 112, a buffer 116, an internal memory of the controller 108, such as static random access memory (SRAM), and the like. In examples where the data storage device 106 does not include a DRAM (i.e., optional DRAM 118), the controller 108 may utilize the HMB 150 as the DRAM of the data storage device 106.

The data storage device 106 includes the controller 108, NVM 110, a power supply 111, volatile memory 112, the interface 114, a write buffer 116, and an optional DRAM 118. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)). Likewise, the optional DRAM 118 may be utilized to store mapping data, buffered commands, logical to physical (L2P) tables, metadata, cached data, and the like in the optional DRAM 118. In some examples, the data storage device 106 does not include the optional DRAM 118, such that the data storage device 106 is DRAM-less. In other examples, the data storage device 106 includes the optional DRAM 118.

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

The controller 108 may include an optional second volatile memory 120. The optional second volatile memory 120 may be similar to the volatile memory 112. For example, the optional second volatile memory 120 may be SRAM. The controller 108 may allocate a portion of the optional second volatile memory to the host device 104 as controller memory buffer (CMB) 122. The CMB 122 may be accessed directly by the host device 104. For example, rather than maintaining one or more submission queues in the host device 104, the host device 104 may utilize the CMB 122 to store the one or more submission queues normally maintained in the host device 104. In other words, the host device 104 may generate commands and store the generated commands, with or without the associated data, in the CMB 122, where the controller 108 accesses the CMB 122 in order to retrieve the stored generated commands and/or associated data.

Figure 2:
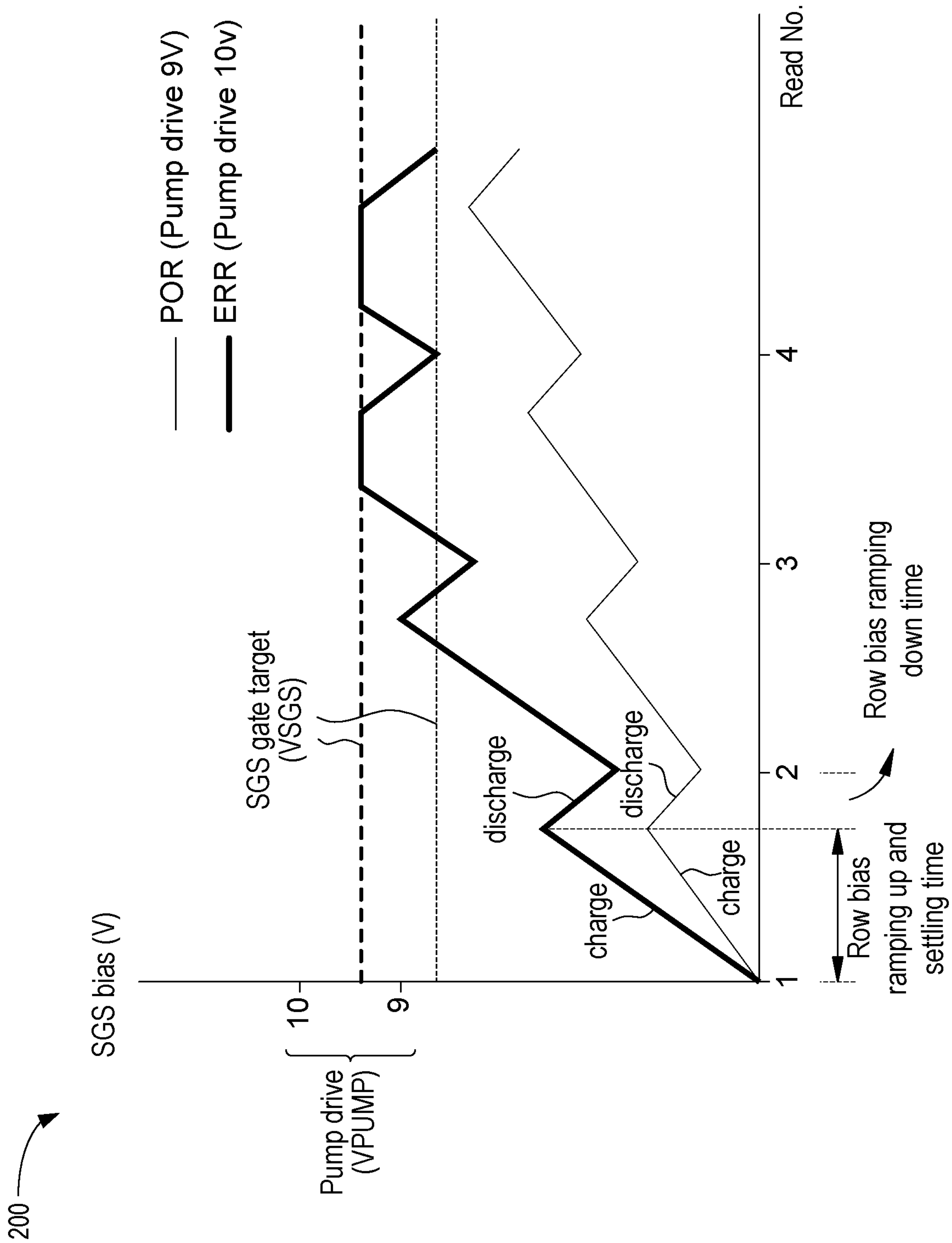
FIG. 2 is a graph of an analytical model of SGS gate bias, according to certain embodiments.

FIG. 2 is a graph of an analytical model 200 of SGS gate bias, according to certain embodiments. In this example, SGS row (line) is open, it causes consecutive fail events for a few pages, until SGS is fully charged up. Analytical model 200 is of SGS bias change with respect to read numbers (read attempts). Due to the additional RC delay by $R_{via}$ and $C_{via}$, SGS charging may be very slow. SGS discharging level should be much less than charging since the pump keeps charging SGS gate during entire WL ramping up clock and WL settling clock, while the pump only discharges the SGS gate by a very short WL ramping down clock. Therefore, the SGS gate will gradually get close to the target bias VSGS (bottom horizontal dash line) by increasing read numbers. So, if the pump drive is enhanced, VSGS should approach the original target more quickly, which means red solid line will exceed blue dash line more easily.

Figure 3:
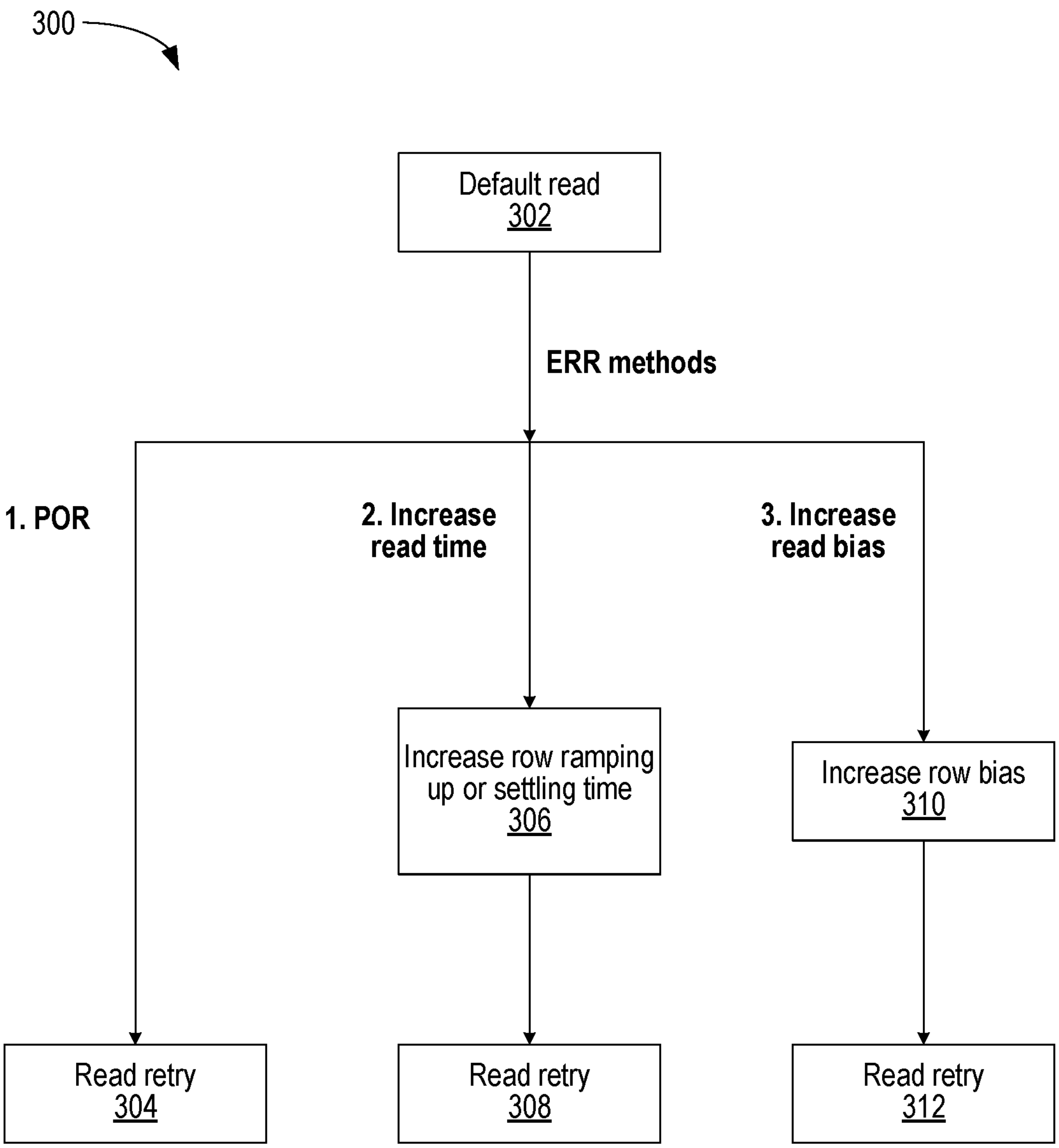
FIG. 3 is a flow chart illustrating data flow with read retry conditions, according to certain embodiments.

FIG. 3 is a flow chart illustrating a method 300 for data flow with different enhanced read retry methods, according to certain embodiments. In this example data flow always begins with a default read attempt. Method 300 begins at block 302. At block 302, a default read attempt is executed that results in a read failure. The path that begins at block 304 is for a power on reset (POR) method, meaning no changes from default settings. The path that begins at block 306 is the method of increasing read time. The path that begins at block 310 is the method of increasing read bias. It is to be understood that after block 302, method 300 may continue to multiple different paths, the same path multiple times, or a combination of the two. For example method 300 may take the POR path and the longer time path simultaneously. In another example method 300 may take the longer time path and loop method 300 again and take the same longer wait time path. Another example maybe that method 300 may take the higher bias path and loop method 300 again and take the higher bias path and the POR path. The combinations of paths is infinite after entering ERR mode after default read attempt at block 302.

After the default read attempt at block 302 method 300 may proceed to block 304. At block 304, a read retry is executed. After the default read attempt at block 302 method 400 may proceed to block 306. At block 306, the row ramping up time or settling time is increased. At block 308, a read retry is executed following the read timing increase. After the default read attempt at block 302 method 300 may proceed to block 310. At block 310, the row bias increase is implemented. At block 312, a read retry is executed after row bias increase is implemented.

The read flow in method 300 can be accelerated by system data. When dealing with issues that require small adjustments to voltages, ones (or zeros) counts should be fairly uniform; however, in the case of a broken row, there will be a very large number of bits that look significantly more programmed. If the bit error rate is high, for example 50%, a broken row is highly probable. There may be an opportunity to skip some of the various read retry steps and start to go into a broken row detection mode earlier in the recovery flow.

The read flow can also be accelerated by using a means to check all rows at once, rather than running a row RC check, as any broken row can be responsible for the problem, but typically not necessary to know what specific row is responsible for the problem. To implement, one would perform a string sense, with all the rows set to a pass voltage, on the string that has encountered the error. The ones/zeros can be counted (either by a sense amp, or by the system) to see if almost all of the bits read as ones (one being an indicator of a conducting memory hole). If all (or almost all) bits read as one (erased state) then less than likely there would be a broken row problem. Though a row recovery scheme could still be run after exhausting all other recovery routes, for thoroughness.

To further quantify/characterize a row failure, one could sense the string multiple times, which would progressively increase voltage on any broken WL, and then compare the improvement from one sense to the next. Improvement with multiple senses would be indicative of a broken row problem. (Several senses would likely be sufficient.) Additionally, one could increase the time of the sense in this process, as allowing for a longer time would increase the voltage on the WL, which has merit, but may have consequences for some array reliability mechanisms. As was done with the multiple pulses, the improvement in ones/zeros count would be compared as evidence of a broken row.

Additionally, the voltage can be increased with successive pulses when doing multiple senses, and again improvement would be noted by the improving ones/zeros count. The number of senses, magnitude of voltage, or length of time needed to get the ones count to an appropriate level could be indicative of the scope of the problem, which could go into determinations of future reliability for using this block, although most systems would likely not want to count on this block and would mark the block as bad. A broken row could easily cause future programs to verify prematurely, so the recommendation would be to mark the block bad.

The information on the scope of the problem can be used to dictate the magnitude of the changes in voltages needed for recovery of the data. Also, once the point of conduction is reached in the string, based on this characterization, best practice may be to do a read of the data immediately, to see if the data is recoverable, as the string is now conducting. Once this characterization is known, use these same settings on all unrecoverable pages on the block and to relocate them elsewhere.

There may be a need to increase the time to discharge or take the rows to ground once the recovery process is complete because some signals are shared among certain unselected blocks, on different strings within the same blocks, and possibly in other places in other architectures. If time cannot be added, then the system can wait for a delay and the electrons will dissipate. The unselected blocks share decoder information and are energized at the same time. A problematic row could be an SGS or SGD line and that could cause significant issues when sensing nearby locations, at a minimum, and possibly in sensing any location in other architectures. If there is no discharge of the lines of blocks, then nearby good blocks may be impacted by the lack of time to discharge. The length of the discharge time increase should be proportional to the magnitude of effort needed to make the string conduct as characterized by the methods discussed in the previous paragraphs.

Increasing the voltage on the neighboring WL during a read may be beneficial to the read operation. For example, if WL90 is being read, WL89 and WL91 might have their pass voltages slightly increased, so as to not interfere with the reading of WL90. Such an offset would likely be in the range of 0.5V to 3V, and that could be reduced or removed if an issue is seen on reading a particular WL. Applying the reduction/removal to the offset can be done during all reads. The targeted approach may yield fewer bit errors when reading WLs that do not have impacted neighbors. Thus yielding better performance in data recovery.

Figure 4A:
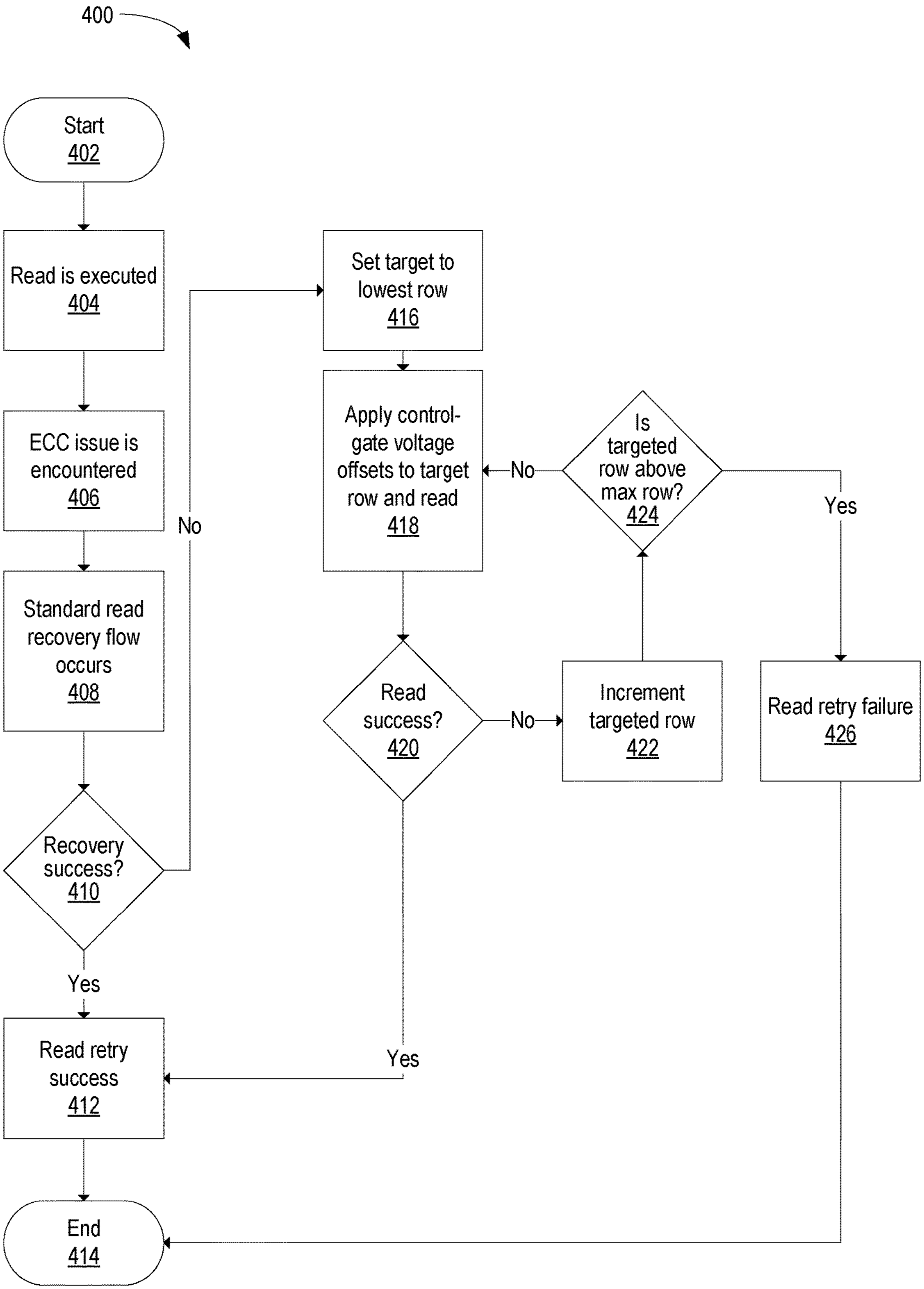
FIGS. 4A-4C are flowcharts illustrating a row-by-row check by voltage increases.
Figure 4B:
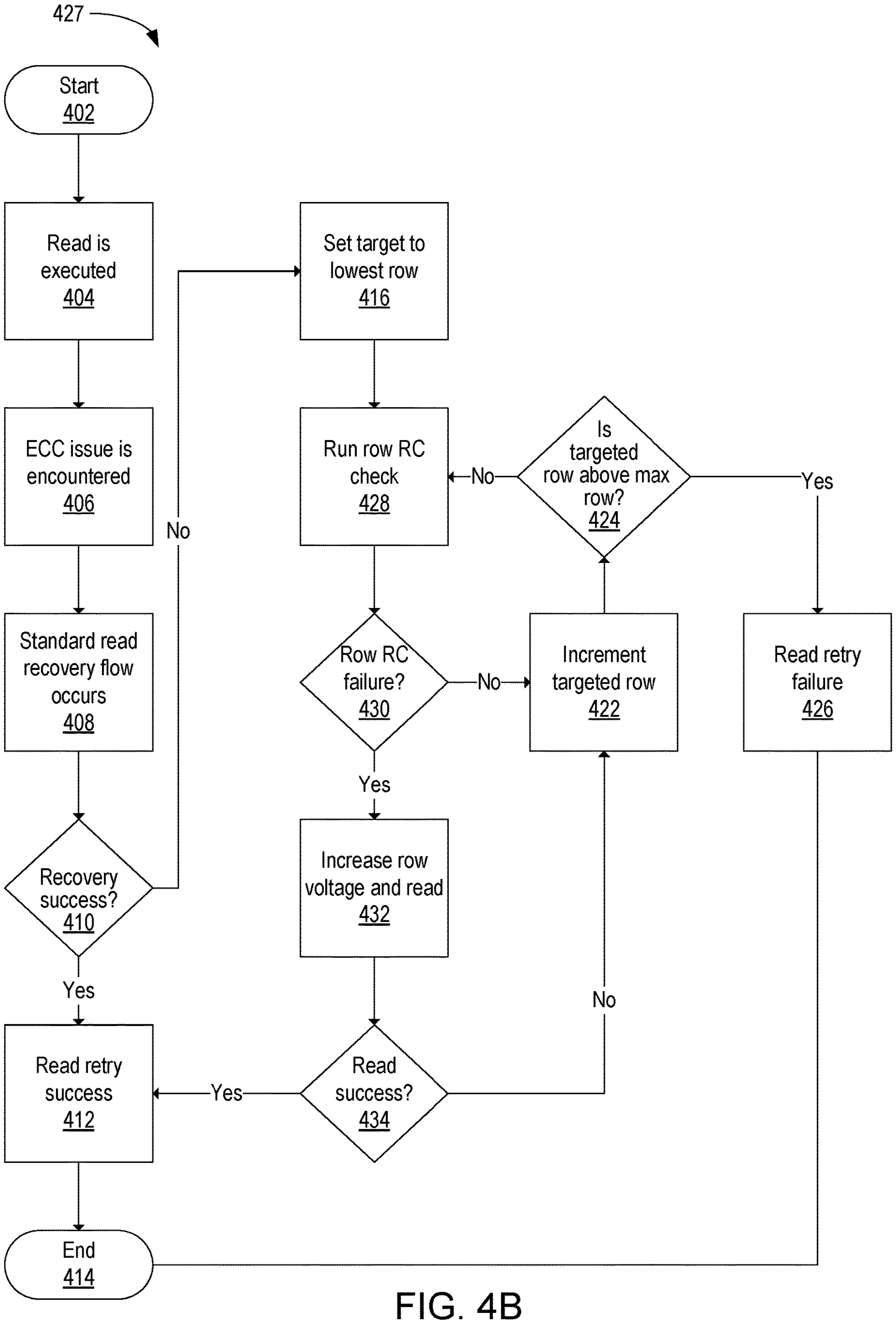
Figure 4C:
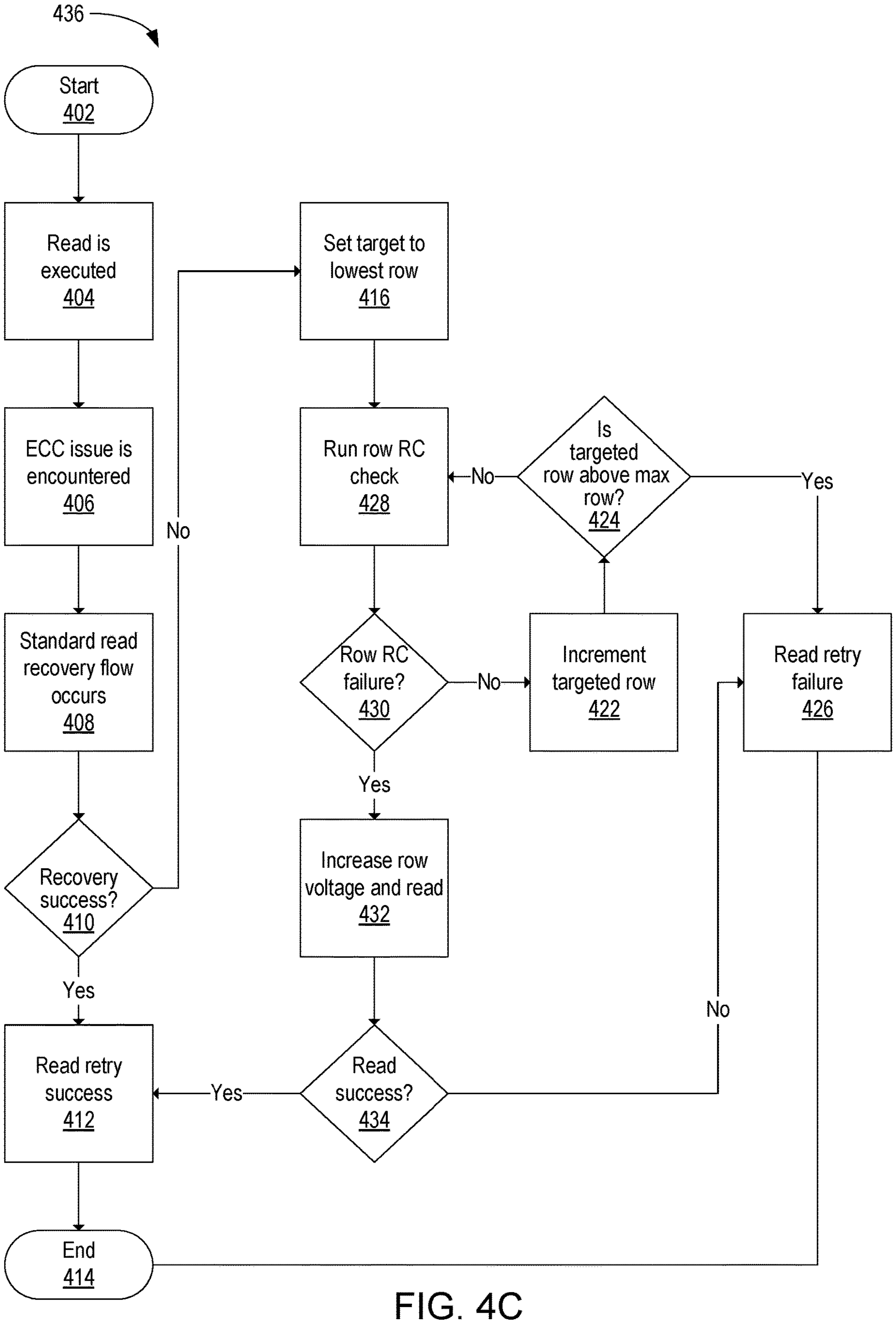
Figure 4D:
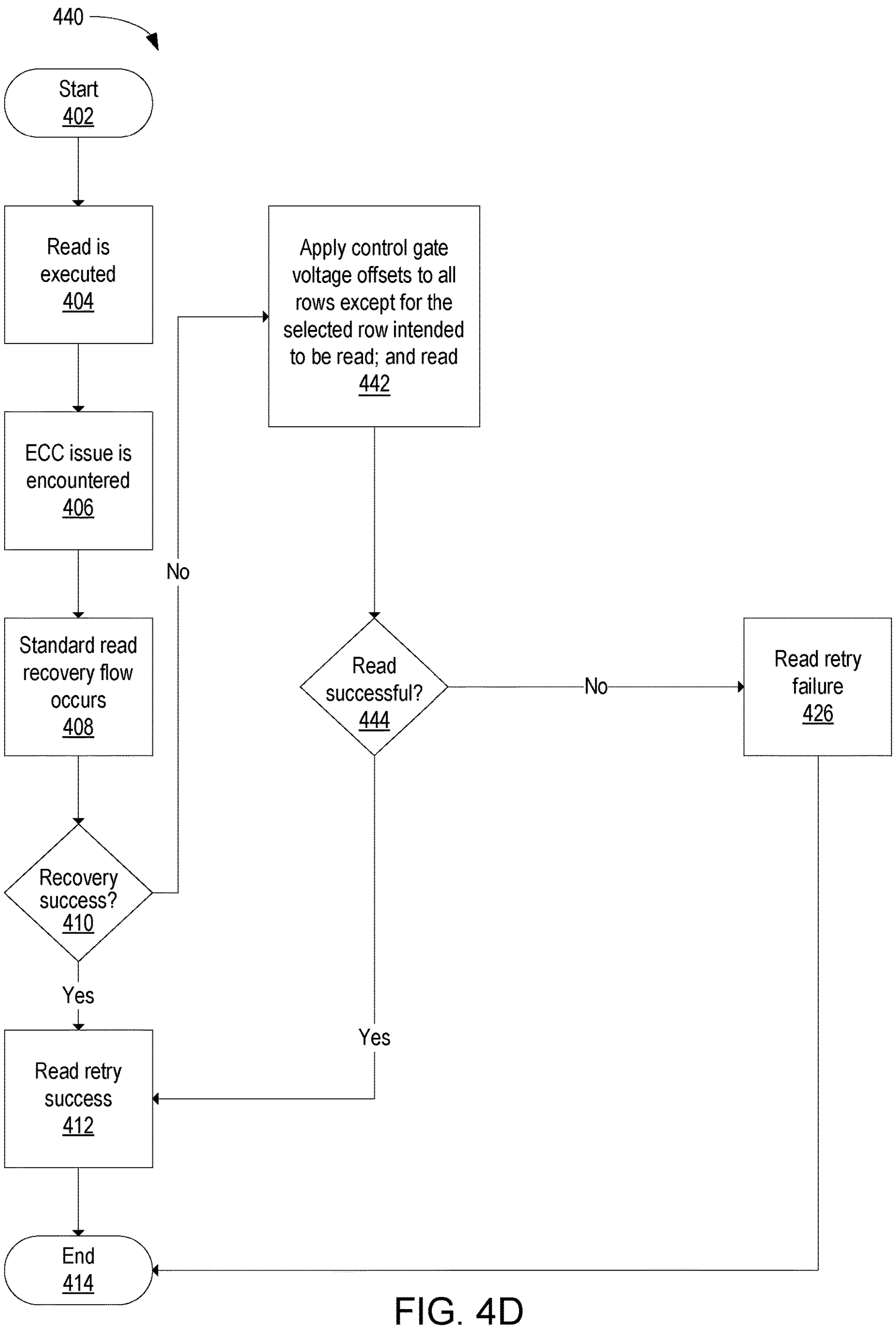
FIGS. 4D and 4E are flowcharts illustrating an all row check by voltage increase.
Figure 4E:
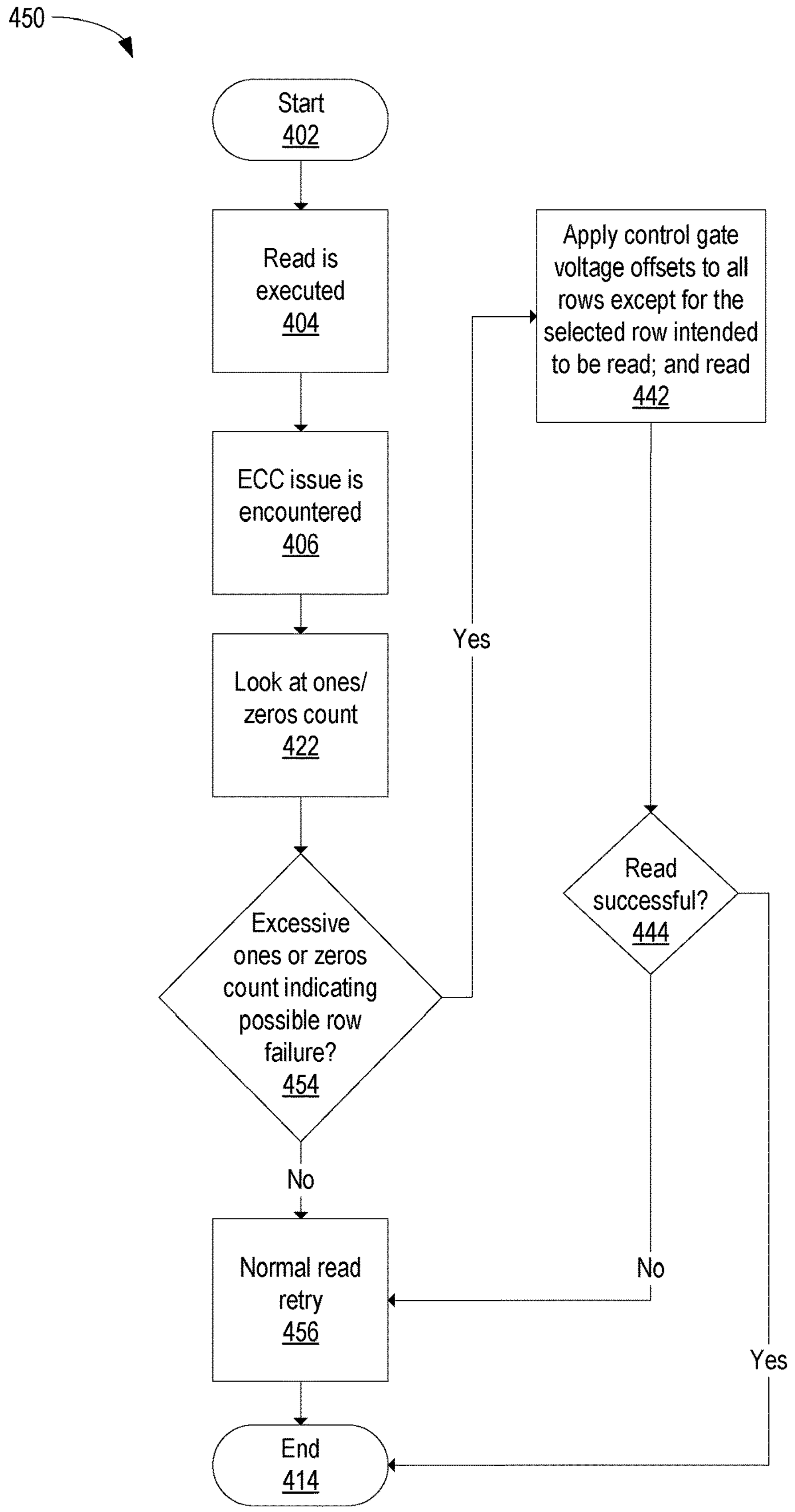

FIGS. 4A-4C are flowcharts illustrating a row-by-row check with voltage increases. FIGS. 4D and 4E are flowcharts illustrating an all row check with voltage increase. In FIG. 4A, the flowchart 400 illustrates the method to start at 402 followed by a read command (a first read attempt) being executed at 404 on a selected row. An error correction code (ECC) issue is encountered at 406 and the standard read recovery flow occurs at 408. A determination is made at 410 regarding whether the read recovery flow was successful. If the read recover flow was successful, then a read retry occurs and is successful at 412 and the method ends at 414. If the read recovery flow is not successful, then a target row or WL is set to the lowest row at 416 followed by applying the control-gate voltage offsets to the target row during another read attempt of the selected row at 418. A determination is then made at 420 regarding the read success of the other read attempt. If the read attempt was successful, then the method continues to 412, and ends at 414. If the read attempt was not successful, then the targeted row is increased at 422 followed by a determination regarding whether the targeted row is above the max row at 424. If the targeted row is not above the max row, then the method continues to 418, but if the targeted row is above the max row then the method continues to 426 where the read retry is declared a failure followed by the method ending at 414.

In FIG. 4B, the flowchart 427 is similar to the flowchart 400 of FIG. 4A, but after the target row is set to the lowest row at 416, an RC check is run at 428. A determination is then made at 430 regarding whether there is an RC failure. If there is no RC failure, then the method continues to 422. If there is an RC failure, then the target row voltage is increased and the selected row is read at 432 using the increased target row voltage. A determination is then made regarding whether there is a read success at 434. If there is a read success, then the method continues to 412. If there is no read success, then the method continues to 422. In FIG. 4C, the flowchart 436 is identical to the flowchart 427 of FIG. 4B, except that if there is no read success at 434, the method proceeds to 426 rather than 422.

In FIG. 4D, the flowchart 440 involves an all row check with voltage increase. If the recovery is not successful at 410, then a control-gate voltage offset is applied to all unselected rows followed by a read attempt of the selected row at 442. A determination is then made at 444 regarding whether the read attempt was successful. If the read attempt was successful, then the method proceeds to 412, but if the read attempt was not successful, then the method proceeds to 426.

In FIG. 4E, a fast all row check is performed with voltage increase in flowchart 450. After the ECC issue is encountered at 406, the method involves taking a look at the ones/zeros count at 422. A determination is made at 454 regarding whether there is an excessive amount of ones or zeros which indicates a possible row failure. Ones and zeros are typically balanced at 50/50. A ratio of 70/30 or even 60/40 could indicate that there is a row failure. If there are no excessive count, then normal read retry occurs at 456 and the method then ends at 414. If there is an excessive count, then the control-gate voltage offsets are applied to all unselected rows and a read attempt of the selected row occurs at 442 followed by the determination at 444 of whether the read attempt a read success. If there is a read success, then the method ends at 414, but if there is not a read success, then the method proceeds to 456.

Although FIGS. 4A-4E show that there can be a bump up of the voltage, there could also be an increase of time, or multiple pulses at the same voltage, or a combination of all three, as previously discussed.

The minimum row does not have to be the start of any check as row susceptibility likely varies based on layout/routing, semiconductor processing, and electrical design, so it is entirely possible that one would start at a higher than minimum row when checking row-by-row. As the susceptibility varies, the incrementing may result in moving to the next row on a list of rows with similar susceptibility, with the most susceptible rows being chosen first, and the least susceptible rows being chosen last. Susceptibility (and thus order) may vary from one die to the next, based on if the die has a history of issues on a particular row or on particular rows or wafer location. Additionally, susceptibility (and thus order) may vary between material batches due to process changes. Finally, susceptibility for a particular die may vary over time, as the system learns that a particular die is seeing particular rows having issues, it may jump to those rows first to try to recover the data faster. Also, the system may opt to use dummy data on those rows. Additionally, the ones/zeros count early jump over to the flow could be done in combination with the row-by-row methodology, even though it is not shown.

Where the read error is encountered will likely determine what course of action (flow) is taken. As an example, in the case of a host read of the data, an all-row check may be used, as that is the fastest to execute, which involves trading information about the issue for speed. As another example, a background data scan could be where this issue is encountered, in such cases, one might do a row-by-row check to learn what row is the source of the problem. Other situations might include: forced garbage collection to free up blocks, where the all-row check would likely be used or garbage collection for the purpose of wear-leveling, or at idle times, where the row-by-row check could be used.

Once an all-row check is used, it is quite possible that a row-by-row check would then be used at a later point in time to determine the source of the issue. Such a time would likely require a long delay to ensure that the rows are fully discharged, or a specifically elongated discharge time where all rows are connected to ground to ensure that they are fully discharged. As an example, thirty minutes of delay could be used of five milliseconds of discharge time could be used, for likely examples of times. Once the system knows the source of the problem, there are a few routes that are likely to be taken. For example, while any row can cause an issue, not all rows are as readily worked around. If the issue is on a select gate, then the issue may be impacting only one string, or one quarter of the block. As a mitigation step, the portion of the block could be avoided, or filled with dummy data. If the issue is on a dummy wordline (i.e. a wordline that is near the select gates or joints and does not hold data), then the voltage may not be so easy to control, and the block may be retired. If the issue is on a data wordline, which is easy to control the voltage on, then it is quite possible that the block could be used still. Future use might not include data on that wordline, as then the wordline would be easier to make conducting. Also, as the wordline itself is problematic, future use might include writing dummy data there, or even dummy data with patterns that result in lower VTs in general, such as SLC, or lowest VT state data patterns.

If a specific data wordline was to become problematic on a multiple blocks on a die, especially in the same plane, then the system might proactively retire that wordline from data storage use on the plane or die where that is causing a problem. As such issue is due to a broken wordline, rather than a shorted wordline, it is entirely possible that normal padding around global WL failures might be avoided, in favor of just ignoring this one wordline. Other schemes for wordline retirement, either on a block level or on a die/plane level, often include padding the failure with other wordlines as the wordline may be shorted to other nearby wordlines. In the case of embedded or client devices, it is quite possible that one would jump through the previously described hoops, as the systems are often lacking in spare area, but it is very likely that in an enterprise drive (where spare area is typically abundant) the system would likely not jump through those hoops and just retire the die (or plane) that is impacted. Enterprise would still benefit from figuring out the cause of the problem for faster data migration from the die that is being retired.

By implementing ERR method, user is able to solve massive data loss events issue due to any of SG, dummy, and data WLs open failures in the field, which may be a critical system DPPM issue on a device. The technique can perfectly solve this issue from FW coverage. ERR will greatly reduce the UECC risk on the customer.

In one embodiment, a data storage device comprises: a memory device; and a controller coupled to the memory device, wherein the controller is configured to: read a block of the memory device; determine that a read of a first word line WL of the block failed; increase a voltage from a first level to a second level on one or more of: a SGD; one or more dummy WLs; one or more data WLs; and a select gate source SGS; and read data from the first WL. The controller is further configured to retire the block after reading data from the first WL. Increasing the voltage comprises increasing the voltage on the SGD, the one or more dummy WLs, the one or more data WLs, and the SGS. The controller is further configured to determining to enter ERR. The determining to enter ERR comprises performing one or more of: an RC measurement for one or more of the SGD, the one or more dummy WLs, the one or more data WLs, or the SGS; increasing a period of time for a WL to charge up; and increasing the voltage on all WLs. The controller is further configured to determine that a new read of a first WL of the block failed after increasing the voltage. The controller is further configured to increase the voltage from the level to a third level on one or more of: the SGD, the one or more dummy WLs, the one or more data WLs, or the SGS. The controller is further configured to maintain a trim table comprising values for increasing the voltage. The controller is further configured to maintain a trim table comprising values for increasing a row read timing. The controller is further configured to perform a string sense to the first WL with all rows of the block set to a pass voltage. The controller is further configured to bring all WLs to ground after reading data from the first WL.

In another embodiment, a data storage device comprises: a memory device; and a controller coupled to the memory device, wherein the controller is configured to: read a block of the memory device; determine that a read of a first WL of the block failed; trigger RC measurements for the first WL; increase a voltage on one or more of the WLs; and read data from the first WL. The controller is further configured to: determine that a previous read the first WL has failed; and retire the block when a number of previous failures exceeds a threshold. Global WL signals are shared by multiple WLs, wherein the controller is further configured to: map WLs back to common signals of the multiple WLs; tally up counts of failures of the multiple WLs; and retire the block when the count exceeds a predetermined threshold. The triggering occurs after reading all WLs of the block. The increasing of the voltage occurs based upon retrieving voltage increase information from a predefined table. The controller is further configured to discharge the one or more WLs. The controller is further configured to increase a sense period of time for reading the first WL.

In another embodiment, a data storage device comprises: memory means; and a controller coupled to the memory means, wherein the controller is configured to: determine that a read failure of one or more WLs of a block of the memory means has occurred; increase a voltage to one or more of the following until either the one or more WLs can be read or a maximum voltage has been reached: a SGD; one or more dummy WLs; one or more data WLs; and a SGS. The increasing the voltage occurs after performing a read recovery operation. The increasing the voltage occurs after completing a read operations for all WLs of the block.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a memory device; and
a controller coupled to the memory device, wherein the controller is configured to:
attempt to read a block of the memory device; and
in response to determining that the read attempt of a first word line (WL) of the block failed, increase a voltage from a first level to a respective second level on two or more of:
a select gate drain (SGD);
one or more dummy WLs;
one or more data WLs; and
a select gate source (SGS); and
make a subsequent attempt to read data from the first WL, wherein the controller is further configured to retire the block after attempting reading data from the first WL.

2. The data storage device of claim 1, wherein increasing the voltage comprises increasing the voltage on the SGD, the one or more dummy WLs, the one or more data WLs, and the SGS.

3. The data storage device of claim 1, wherein the controller is further configured to bring all WLs to ground after attempted reading data from the first WL.

4. A data storage device, comprising:
a memory device; and
a controller coupled to the memory device, wherein the controller is configured to:
attempt to read a block of the memory device; and
in response to determining that the read attempt of a first word line (WL) of the block failed, increase a voltage from a first level to a respective second level on two or more of:
a select gate drain (SGD);
one or more dummy WLs;
one or more data WLs; and
a select gate source (SGS); and
make a subsequent attempt to read data from the first WL, wherein the controller is further configured to determine that a new read attempt of the first word line (WL) of the block failed after increasing the voltage to the second level.

5. The data storage device of claim 4, wherein the controller is further configured to increase the voltage from the second level to a third level on one or more of: the SGD, the one or more dummy WLs, the one or more data WLs, or the SGS.

6. The data storage device of claim 5, wherein the controller is further configured to maintain a trim table comprising values for increasing the voltage or increasing row read timing.

7. A data storage device, comprising:

a memory device; and a controller coupled to the memory device, wherein the controller is configured to:

read a block of the memory device; and in response to determining that a read attempt of a first word line (WL) of the block failed, trigger RC measurements for the first WL, increase a voltage on one or more of the WLs, and retry to read data from the first WL, wherein the triggering occurs after attempted reading all WLs of the block.

8. The data storage device of claim 7, wherein the controller is further configured to:

determine that a previous read attempt of the first WL has failed; and retire the block when a number of previous read attempt failures exceeds a threshold.

9. The data storage device of claim 7, wherein the increasing of the voltage occurs based upon retrieving voltage increase information from a predefined table.

10. The data storage device of claim 7, wherein the controller is further configured to discharge the one or more WLs.

11. The data storage device of claim 7, wherein the controller is further configured to increase a sense period of time for reading the first WL.

* * * * *